US012627261B2

(12) United States Patent
Chen et al.

(10) Patent No.: US 12,627,261 B2
(45) Date of Patent: May 12, 2026

(54) AMPLIFYING CIRCUIT

(71) Applicant: RichWave Technology Corp., Taipei (TW)

(72) Inventors: Chih-Sheng Chen, Taipei (TW); Yu-Hsuan Chao, Taipei (TW)

(73) Assignee: RichWave Technology Corp., Taipei (TW)

( * ) Notice: Subject to any disclaimer, the term of this patent is extended or adjusted under 35 U.S.C. 154(b) by 612 days.

(21) Appl. No.: 18/081,625

(22) Filed: Dec. 14, 2022

(65) Prior Publication Data

US 2024/0186952 A1      Jun. 6, 2024

(30) Foreign Application Priority Data

Dec. 2, 2022   (TW) .................................. 111146268
Dec. 6, 2022   (TW) .................................. 111146684

(51) Int. Cl.
*H03F 1/22*        (2006.01)
*H03F 1/02*        (2006.01)
*H03F 3/193*        (2006.01)

(52) U.S. Cl.
CPC ........... *H03F 1/0205* (2013.01); *H03F 3/193* (2013.01); *H03F 2200/451* (2013.01)

(58) Field of Classification Search
CPC ....................................................... H03F 1/22
USPC ................................................. 330/311, 310
See application file for complete search history.

(56) References Cited

U.S. PATENT DOCUMENTS

| | | | | |
|---|---|---|---|---|
| 8,305,139 | B1 * | 11/2012 | Dykstra | .............. H03F 3/45183 |
| | | | | 330/311 |
| 9,407,215 | B2 | 8/2016 | Gill | |
| 9,935,585 | B2 | 4/2018 | Shirvani | |
| 2020/0403580 | A1 | 12/2020 | Seshita et al. | |
| 2022/0263469 | A1 | 8/2022 | Ayranci et al. | |

FOREIGN PATENT DOCUMENTS

| | | |
|---|---|---|
| CN | 107332522 | 12/2020 |
| TW | I662787 | 6/2019 |

OTHER PUBLICATIONS

"Office Action of Taiwan Counterpart Application, Application No. 111146684", issued on Jul. 21, 2023, p. 1-p. 4.

* cited by examiner

*Primary Examiner* — Henry Choe
(74) *Attorney, Agent, or Firm* — JCIPRNET

(57) ABSTRACT

An amplifying circuit includes a first transistor, a second transistor, and a switching circuit. A control terminal of the first transistor is coupled to an input terminal of the amplifying circuit, and a first terminal of the first transistor is coupled to a first reference end. The input terminal of the amplifying circuit receives a first radio frequency (RF) signal. A first terminal of the second transistor is coupled to a second terminal of the first transistor, and a second terminal of the second transistor is coupled to an output terminal of the amplifying circuit. The output terminal of the amplifying circuit outputs an amplified signal. The first transistor amplifies the first RF signal to generate a second RF signal. The switching circuit performs a switching operation to transmit the second RF signal to one of the first terminal and the control terminal of the second transistor.

19 Claims, 7 Drawing Sheets

AMPLIFYING CIRCUIT

CROSS-REFERENCE TO RELATED APPLICATION

This application claims the priority benefits of Taiwanese application no. 111146268, filed on Dec. 2, 2022 and Taiwanese application no. 111146684, filed on Dec. 6, 2022. The entirety of each of the above-mentioned patent applications is hereby incorporated by reference herein and made a part of this specification.

BACKGROUND

Technical Field

The disclosure relates to an amplifying circuit. In particular, the disclosure relates to an amplifying circuit that may switch between two different operation modes.

Description of Related Art

In technical fields, a single-stage or multi-stage amplifying circuit may be used. The single-stage amplifying circuit may meet the requirements for relatively low power consumption, but may provide limited gain. The multi-stage amplifying circuit may provide relatively large gain, but may consume relatively high power. To address the above-mentioned issues, for example, a two-stage amplifier may be used to construct an amplifying circuit. However, in the two-stage amplifier, linearity may be adversely affected during operation.

SUMMARY

The disclosure provides multiple embodiments of an amplifying circuit, which may switch between at least two different operation modes to achieve better tradeoff among power consumption, gain, and/or linearity.

According to an embodiment of the disclosure, an amplifying circuit includes a first transistor, a second transistor, and a switching circuit. The first transistor has a first terminal, a second terminal, and a control terminal. The control terminal of the first transistor is coupled to an input terminal of the amplifying circuit, and the first terminal of the first transistor is coupled to a first reference end. The input terminal of the amplifying circuit is configured to receive a first radio frequency signal. The second transistor has a first terminal, a second terminal, and a control terminal. The first terminal of the second transistor is coupled to the second terminal of the first transistor, and the second terminal of the second transistor is coupled to an output terminal of the amplifying circuit. The output terminal of the amplifying circuit is configured to output an amplified signal. The switching circuit is coupled to the second terminal of the first transistor, the first terminal of the second transistor, and the control terminal of the second transistor. The first transistor amplifies the first radio frequency signal to generate a second radio frequency signal at the second terminal of the first transistor. The switching circuit performs a switching operation to transmit the second radio frequency signal to one of the first terminal of the second transistor and the control terminal of the second transistor.

According to another embodiment of the disclosure, an amplifying circuit includes an input terminal, an output terminal, a first transistor, a second transistor, a first inductor, a first switch, a second switch, a first capacitor, and a third switch. The input terminal is configured to receive a first radio frequency signal. The output terminal is configured to output an amplified signal. The first transistor has a first terminal, a second terminal, and a control terminal. The control terminal of the first transistor is coupled to the input terminal of the amplifying circuit, and the first terminal of the first transistor is coupled to a first reference end. The second transistor has a first terminal, a second terminal, and a control terminal. The second terminal of the second transistor is coupled to the output terminal of the amplifying circuit. The first inductor is coupled between the second terminal of the first transistor and the first terminal of the second transistor. The first switch is coupled between the second terminal of the first transistor and the control terminal of the second transistor. The second switch is coupled in parallel with the first inductor. The third switch is coupled in series with the first capacitor. The first capacitor and the third switch are coupled between the first terminal of the second transistor and a second reference end.

Based on the foregoing, in the embodiment of the disclosure, the amplifying circuit may be switched between different modes by the switching circuit. As such, depending on requirements, the amplifying circuit may be adaptively switched, for example, may operate in a general mode or a low current mode, accordingly improving the operational efficiency of the amplifying circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figures 1, 2:
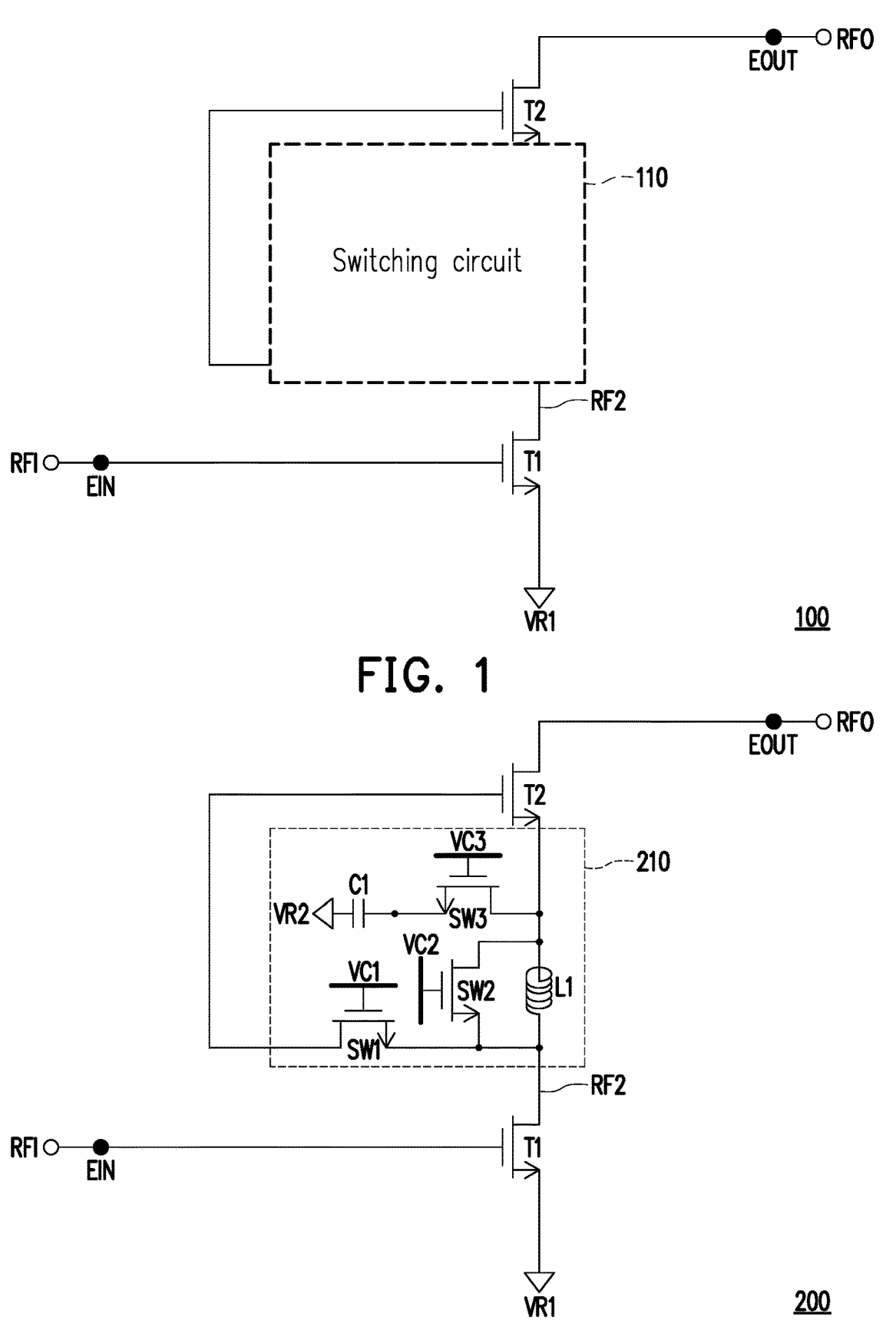
FIG. 1 is a schematic diagram of an amplifying circuit according to an embodiment of the disclosure.
FIG. 2 is a schematic diagram of an amplifying circuit according to an embodiment of the disclosure.

With reference to FIG. 1. FIG. 1 is a schematic diagram of an amplifying circuit 100 according to an embodiment of the disclosure. The amplifying circuit 100 includes an input terminal EIN and an output terminal EOUT. The input terminal EIN is configured to receive a radio frequency signal RFI. After the radio frequency signal RFI is amplified, an amplified signal RFO is output at the output terminal EOUT. The amplifying circuit 100 includes transistors T1 and T2 and a switching circuit 110. In some embodiments, the transistor T1 includes a control terminal, a first terminal, and a second terminal. The control terminal of the transistor T1 is coupled to the input terminal EIN of the amplifying circuit 100, the first terminal of the transistor T1 is coupled to a reference end VR1, and the second terminal of the transistor T1 is coupled to the switching circuit 110. The switching circuit 110 is coupled between the transistor T1 and the transistor T2. Specifically, the transistor T2 includes a control terminal, a first terminal, and a second terminal. The first terminal of the transistor T2 may be coupled to the second terminal of the transistor T1 via the switching circuit 110, and the second terminal of the transistor T2 is coupled to the output terminal EOUT of the amplifying circuit 100. Further, the control terminal of the transistor T2 may also be coupled to the second terminal of the transistor T1 via the switching circuit 110.

In some embodiments, the transistor T1 may be configured to amplify the radio frequency signal RFI and generate another radio frequency signal RF2, namely a second radio frequency signal RF2, at the second terminal of the transistor T1. The switching circuit 110 may perform a switching operation, such that the second radio frequency signal RF2 is selectively transmitted to the first terminal of the transistor T2 or to the control terminal of the transistor T2, so as to achieve different operation modes of the amplifying circuit 100. The transistor T2 may generate the amplified signal RFO at the output terminal EOUT of the amplifying circuit 100 according to the second radio frequency signal RF2. In detail, the amplifying circuit 100 may operate in a general mode or a low current mode. In the general mode, the switching circuit 110 may selectively transmit the second radio frequency signal RF2 to the first terminal of the transistor T2. In the low current mode, the switching circuit 110 may selectively transmit the second radio frequency signal RF2 to the control terminal of the transistor T2.

With reference to FIG. 2, FIG. 2 is a schematic diagram of an amplifying circuit 200 according to an embodiment of the disclosure. In the amplifying circuit 200, a switching circuit 210 is coupled to the second terminal of the transistor T1, the first terminal of the transistor T2, and the control terminal of the transistor T2. In this embodiment, the switching circuit 210 includes an inductor L1, switches SW1 to SW3, and a capacitor C1. As shown in FIG. 2, the inductor L1 is coupled between the second terminal of the transistor T1 and the first terminal of the transistor T2. The switch SW2 is coupled in parallel with the inductor L1. The switch SW1 is coupled between the second terminal of the transistor T1 and the control terminal of the transistor T2. The switch SW3 and the capacitor C1 are coupled in series between the first terminal of the transistor T2 and a reference end VR2. In a further embodiment, the inductor L1 may include a first terminal and a second terminal. The first terminal of the inductor L1 is coupled to the second terminal of the transistor T1, and the second terminal of the inductor L1 is coupled to the first terminal of the transistor T2. The switch SW2 may include a first terminal, a second terminal, and a control terminal. The first terminal of the switch SW2 is coupled to the first terminal of the inductor L1, and the second terminal of the switch SW2 is coupled to the second terminal of the inductor L1. In other words, the switch SW2 and the inductor L1 are coupled in parallel.

In some embodiments, for example, the switch SW1, the switch SW2, and/or the switch SW3 may be implemented using transistor. The switches SW1 to SW3 may be respectively controlled by a plurality of control signals VC1 to VC3 to be respectively turned on or turned off. For example, the control terminal of the switch SW2 may be configured to receive the control signal VC2, and the switch SW2 may be turned on or turned off according to the control signal VC2. Similarly, control terminals of the switch SW1 and the switch SW3 may be respectively configured to receive the control signals VC1 and VC3, and the switch SW1 and the switch SW3 may be respectively turned on or turned off according to the control signals VC1 and VC3.

In some embodiments, the reference ends VR1 and VR2 may be the same ground end, or may also be different ends. It should be noted that, in the embodiment shown in FIG. 2, the switch SW3 is located between the first terminal of the transistor T2 and the capacitor C1, but the disclosure is not limited thereto. In other embodiments, the positions of the switch SW3 and the capacitor C1 may be exchanged, that is, the capacitor C1 may be located between the first terminal of the transistor T2 and the switch SW3.

When the amplifying circuit 200 operates in a general mode, the switch SW2 may be turned on and the switch SW1 may be turned off. In this case, the turned-on switch SW2 forms a bypass circuit for the inductor L1. For the second radio frequency signal RF2, a low impedance path is formed between the second terminal of the transistor T1 and the first terminal of the transistor T2, and a high impedance path is formed between the second terminal of the transistor T1 and the control terminal of the transistor T2. Accordingly, the second radio frequency signal RF2 may be substantially transmitted through the turned-on switch SW2 to the first terminal of the transistor T2 to generate the amplified signal RFO at the output terminal EOUT of the amplifying circuit 200. In the general mode, the transistor T1 and the transistor T2 are in a cascade form, so as to improve isolation between input and output of the amplifying circuit 200, and thus to reduce coupling between the input signal and the output signal. Therefore, the amplifying circuit 200 may operate at a relatively large bandwidth. In the general mode, the switch SW3 may be turned off.

In some cases, for example, to reduce power consumption, the amplifying circuit 200 may operate in a low current mode. In this case, the amplifying circuit 200 may change the coupling relationship between the transistor T1 and the transistor T2 to achieve the expected gain. When the amplifying circuit 200 operates in the low current mode, the switch SW2 may be turned off and the switch SW1 may be turned on. In this case, for the second radio frequency signal RF2, a high impedance path (including the inductor L1) is formed between the second terminal of the transistor T1 and the first terminal of the transistor T2, and a low impedance path is formed between the second terminal of the transistor T1 and the control terminal of the transistor T2. Accordingly, the second radio frequency signal RF2 may be substantially transmitted through the turned-on switch SW1 to the control terminal of the transistor T2 to generate the amplified signal RFO at the output terminal EOUT of the amplifying circuit 200. In the low current mode, the transistor T1 and the transistor T2 are in a cascade form. As such, after the radio frequency signal RFI at the input terminal EIN of the amplifying circuit 200 is sequentially amplified by the transistor T1 and the transistor T2, the amplified signal RFO is generated at the output terminal EOUT, thus achieving an expected gain. In the low current mode, the switch SW2 is in an off-state, and the inductor L1 may substantially block the second radio frequency signal RF2 from being transmitted to the first terminal of the transistor T2. In other words, the inductor L1 substantially presents a high impedance state for the second radio frequency signal RF2, so as to reduce loss of the second radio frequency signal RF2. In addition, in the low current mode, the switch SW3 may be turned on, such that the first terminal of the transistor T2 is coupled to the reference end VR2 via the capacitor C1. The capacitor C1 substantially presents a low impedance state for the second radio frequency signal RF2. For example, the impedance of the inductor L1 for the second radio frequency signal RF2 may be higher than a first predetermined value, and the impedance of the capacitor C1 for the second radio frequency signal RF2 may be lower than a second predetermined value, where the first predetermined value is higher than the second predetermined value.

Incidentally, in the general mode, the transistor T1 and the transistor T2 are in a cascode relation, and the transistor T1 and the transistor T2 may share a direct current (DC). Further, in the low current mode, the inductor L1 may allow a DC to pass through, such that the transistor T1 and the transistor T2 may still share a DC even in a cascade relation, thus reducing power consumption.

As described above, in the general mode, the transistor T1 and the transistor T2 of the amplifying circuit 200 are in a cascode form, such that the amplifying circuit 200 may provide a relatively large gain with a relatively large current. Comparatively, to reduce power consumption, the amplifying circuit 200 may operate in the low current mode, i.e., operate with a relatively small current. The connection relationship between the transistor T1 and the transistor T2 may be switched by the switching circuit 210, such that the transistor T1 and the transistor T2 may be in a cascode form or a cascade form, thus achieving an expected gain or power consumption. Accordingly, in an embodiment of the disclosure, the amplifying circuit may achieve expected gain or power consumption in response to different operation currents, accordingly improving the overall efficiency of the system.

Figures 3, 3A:
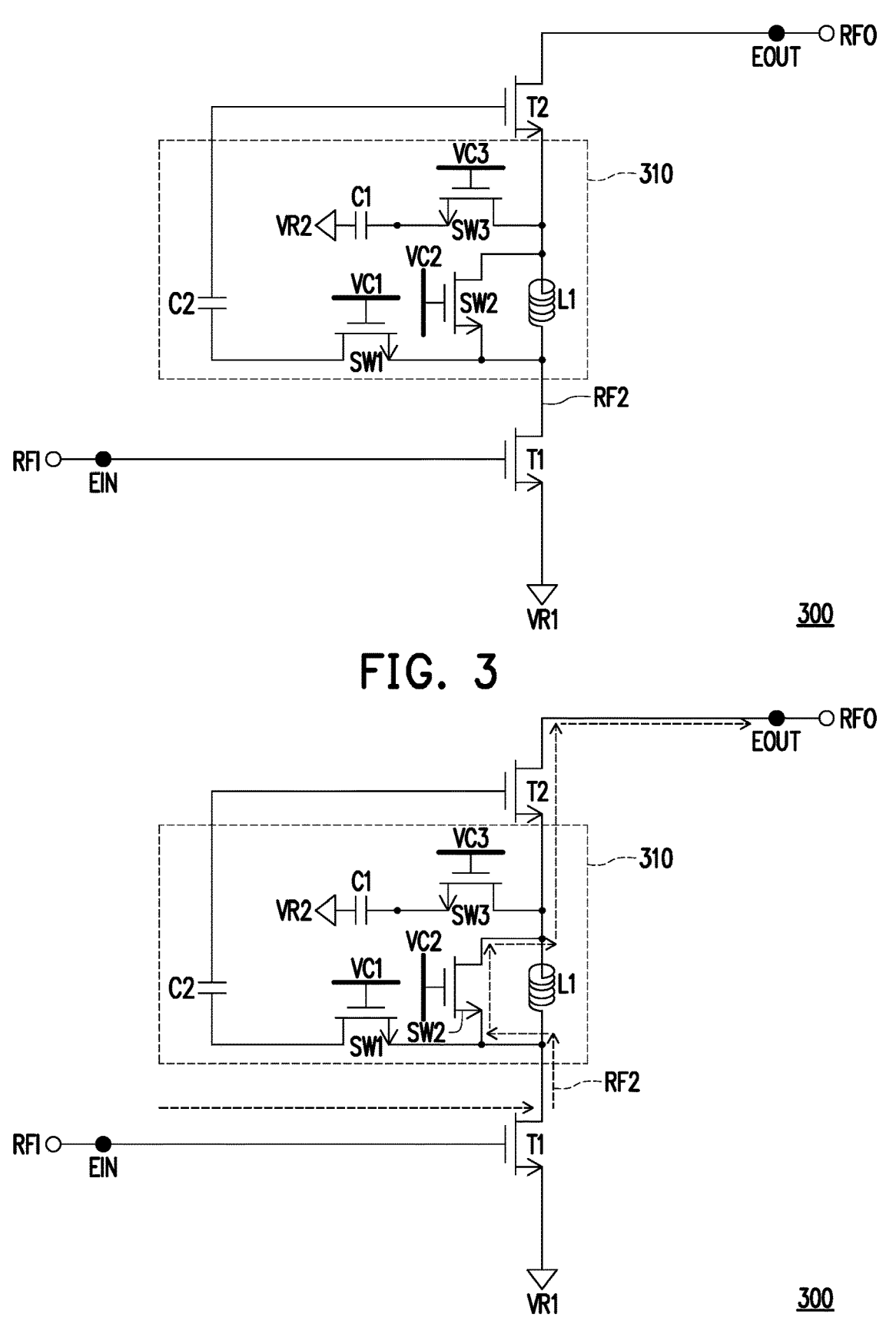
FIG. 3 is a schematic diagram of an amplifying circuit according to another embodiment of the disclosure.
FIG. 3A and FIG. 3B are schematic diagrams of the amplifying circuit in FIG. 3 in different operation modes.
Figures 3B, 4:
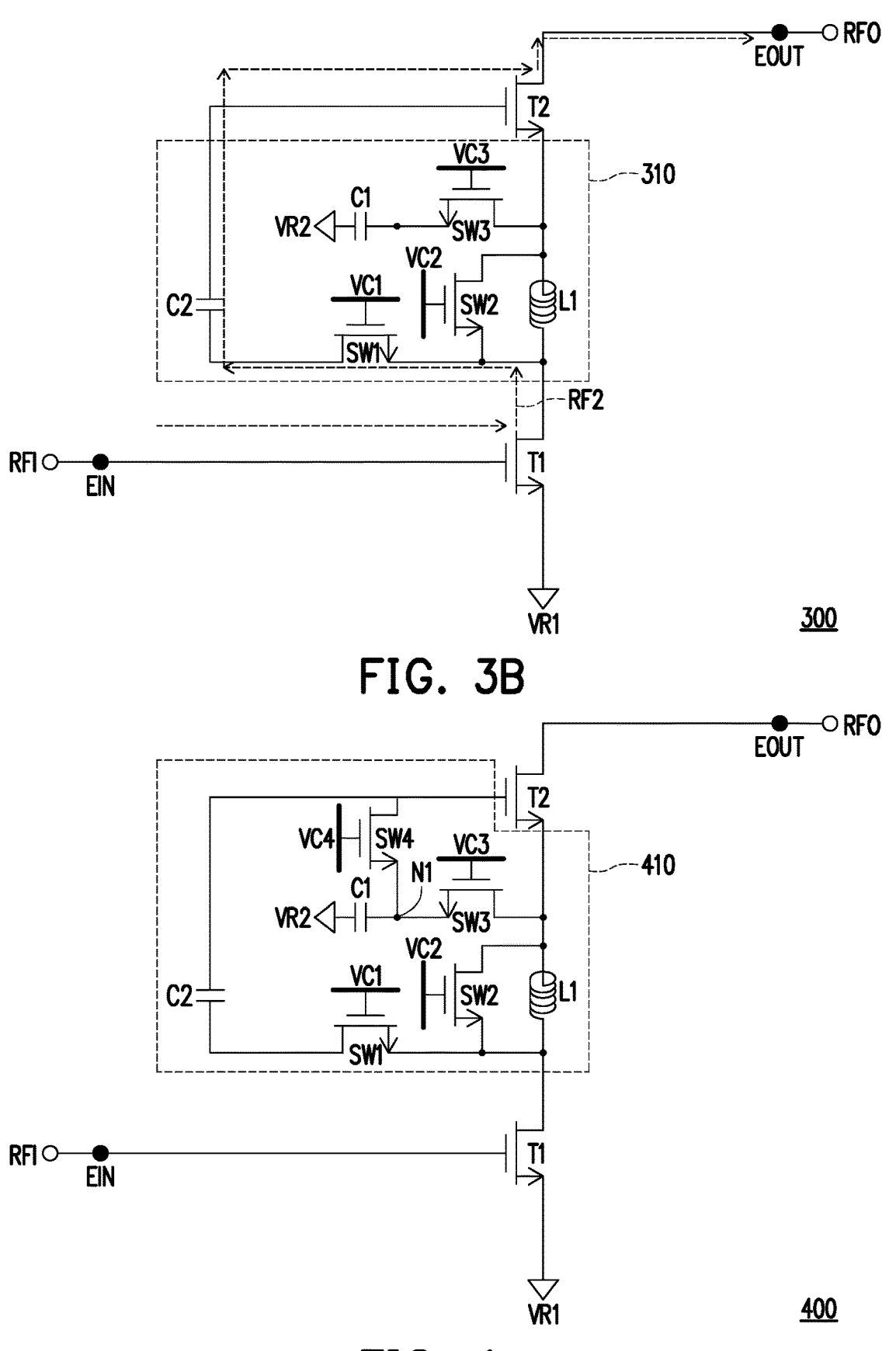
FIG. 4 to FIG. 8 are schematic diagrams of amplifying circuits according to embodiments of the disclosure.

With reference to FIG. 3. FIG. 3 is a schematic diagram of an amplifying circuit 300 according to another embodiment of the disclosure. The amplifying circuit 300 includes the transistors T1 and T2 and a switching circuit 310. The circuit structure of the amplifying circuit 300 is similar to that of the amplifying circuit 200, and the same parts will not be repeatedly described. Different from the amplifying circuit 200, the switching circuit 310 in the amplifying circuit 300 further includes a capacitor C2. The capacitor C2 and the switch SW1 are coupled in series between the second terminal of the transistor T1 and the control terminal of the transistor T2. In the embodiment of FIG. 3, the capacitor C2 is coupled between the switch SW1 and the control terminal of the transistor T2. In other embodiments, the positions of the capacitor C2 and the switch SW1 may be exchanged. In other words, the switch SW1 may be coupled between the capacitor C2 and the control terminal of the transistor T2. For operation details of the amplifying circuit 300, reference may be made to FIG. 3A and FIG. 3B. FIG. 3A and FIG. 3B are respectively schematic diagrams of the amplifying circuit 300 in different operation modes.

In FIG. 3A, the amplifying circuit 300 operates in a general mode. In other words, the amplifying circuit 300 may operate at a relatively large operation current, accordingly obtaining a relatively large gain. In this case, the switch SW2 may be turned on, and the switches SW1 and SW3 may be both turned off. The transistors T1 and T2 of the amplifying circuit 300 are in a cascode state. The transistor T1 amplifies the received radio frequency signal RFI to generate the second radio frequency signal RF2. The second radio frequency signal RF2 may be transmitted through the turned-on switch SW2 to the first terminal of the transistor T2. The transistor T2 may generate the amplified signal RFO according to the second radio frequency signal RF2. In this embodiment, the switch SW2 substantially presents a low impedance for the second radio frequency signal RF2, and the switch SW1 substantially presents a high impedance for the second radio frequency signal RF2.

In FIG. 3B, the amplifying circuit 300 operates in a low current mode. In other words, the amplifying circuit 300 may operate at a relatively small operation current, so as to reduce power consumption. In this case, the switch SW2 may be turned off, and the switches SW1 and SW3 may be both turned on. The transistors T1 and T2 of the amplifying circuit 300 are in a cascade state. The transistor T1 amplifies the received radio frequency signal RFI to generate the second radio frequency signal RF2. The second radio frequency signal RF2 may be transmitted through the turned-on switch SW1 and the capacitor C2 to the control terminal of the transistor T2. The transistor T2 may generate the amplified signal RFO according to the second radio frequency signal RF2. In this embodiment, the capacitor C2 substantially presents a low impedance state for the second radio frequency signal RF2, and the capacitor C2 may be configured to block DC components of the signal. For example, the impedance of the capacitor C2 for the second radio frequency signal RF2 is lower than a third predetermined value, and the first predetermined value is higher than the third predetermined value. As described above, the impedance of the capacitor C1 for the second radio frequency signal RF2 is lower than the second predetermined value. The second predetermined value and the third predetermined value may be the same or different, and may respectively be determined depending on the capacitance values of the capacitors C1 and C2.

In the embodiments above, when being turned on, the switches SW1. SW2, and/or SW3 may present various low impedance states for the second radio frequency signal RF2.

With reference to FIG. 4, FIG. 4 is a schematic diagram of an amplifying circuit according to another embodiment of the disclosure. An amplifying circuit 400 includes the transistors T1 and T2 and a switching circuit 410. The circuit structure of the amplifying circuit 400 is similar to that of the amplifying circuit 300, and the same parts will not be repeatedly described. Different from the amplifying circuit 300, the switching circuit 410 in the amplifying circuit 400 further includes a switch SW4. As shown in FIG. 4, a node N1 may be present between the switch SW3 and the capacitor C1 (i.e., the switch SW3 and the capacitor C1 may each be coupled to the node N1), and the switch SW4 may be coupled between the node N1 and the control terminal of the transistor T2. Further, the first terminal of the transistor T2, the switch SW3, the capacitor C1, and the reference end VR2 may be sequentially coupled, and the node N1 is located between the switch SW3 and the capacitor C1. In this embodiment, the switch SW4 is controlled by a control signal VC4 to be turned on or turned off. In a further embodiment, when the switch SW2 is turned on, the switch SW4 may also be turned on, such that the control terminal of the transistor T2 is coupled to the reference end VR2 via the capacitor C1. In this case, the switch SW3 is turned off. Comparatively, when the switch SW2 is turned off, the switch SW4 may also be turned off, such that the control terminal of the transistor T2 may be isolated from the node N1. In this case, the switch SW3 is turned on, such that the first terminal of the transistor T2 is coupled to the reference end VR2 via the capacitor C1.

In the embodiments above, the switches SW1. SW2, SW3, and/or SW4 may be constructed using transistors of the same conductivity type (e.g., each an N-type transistor or each a P-type transistor). In this state, the control signals VC1 and VC3 may be synchronous in-phase signals, and/or the control signals VC2 and VC4 may be synchronous in-phase signals. Further, the control signals VC1 and VC2 may be synchronous reverse-phase signals. Nonetheless, the disclosure is not limited thereto. In other embodiments, the switches SW1. SW2, SW3, and/or SW4 may be constructed using transistors of different conductivity types (e.g., some N-type transistors, and some others P-type transistors).

Figures 5, 6A:
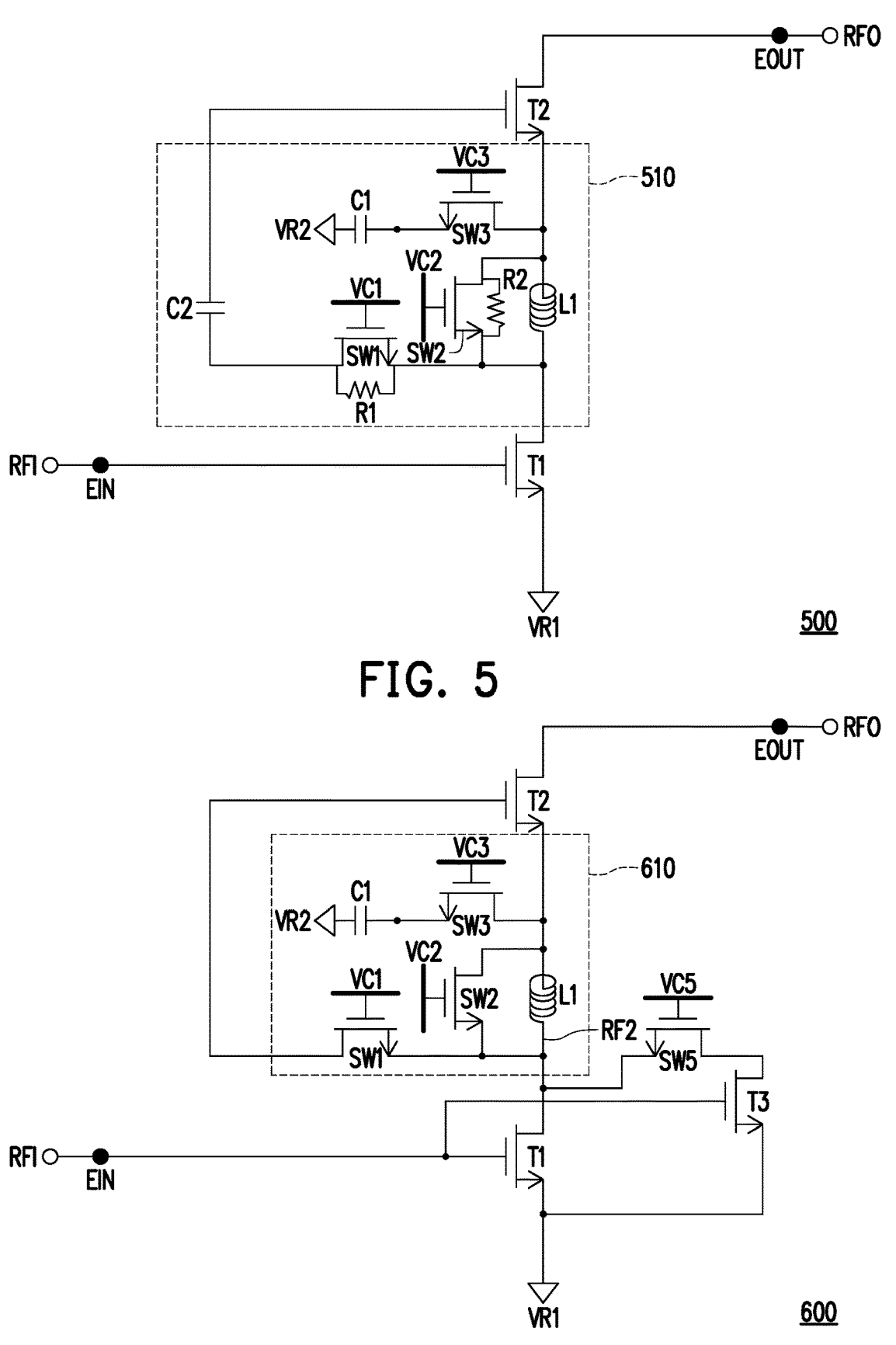

With reference to FIG. 5, FIG. 5 is a schematic diagram of an amplifying circuit 500 according to another embodiment of the disclosure. The amplifying circuit 500 is similar to the amplifying circuit 300, and is different in that a switching circuit 510 of the amplifying circuit 500 further includes operation resistors R1 and R2. The operation resistor R1 may be coupled between a first terminal and a second terminal of the switch SW1. The operation resistor R2 may be coupled between the first terminal and the second terminal of the switch SW2.

Figures 6B, 6C:
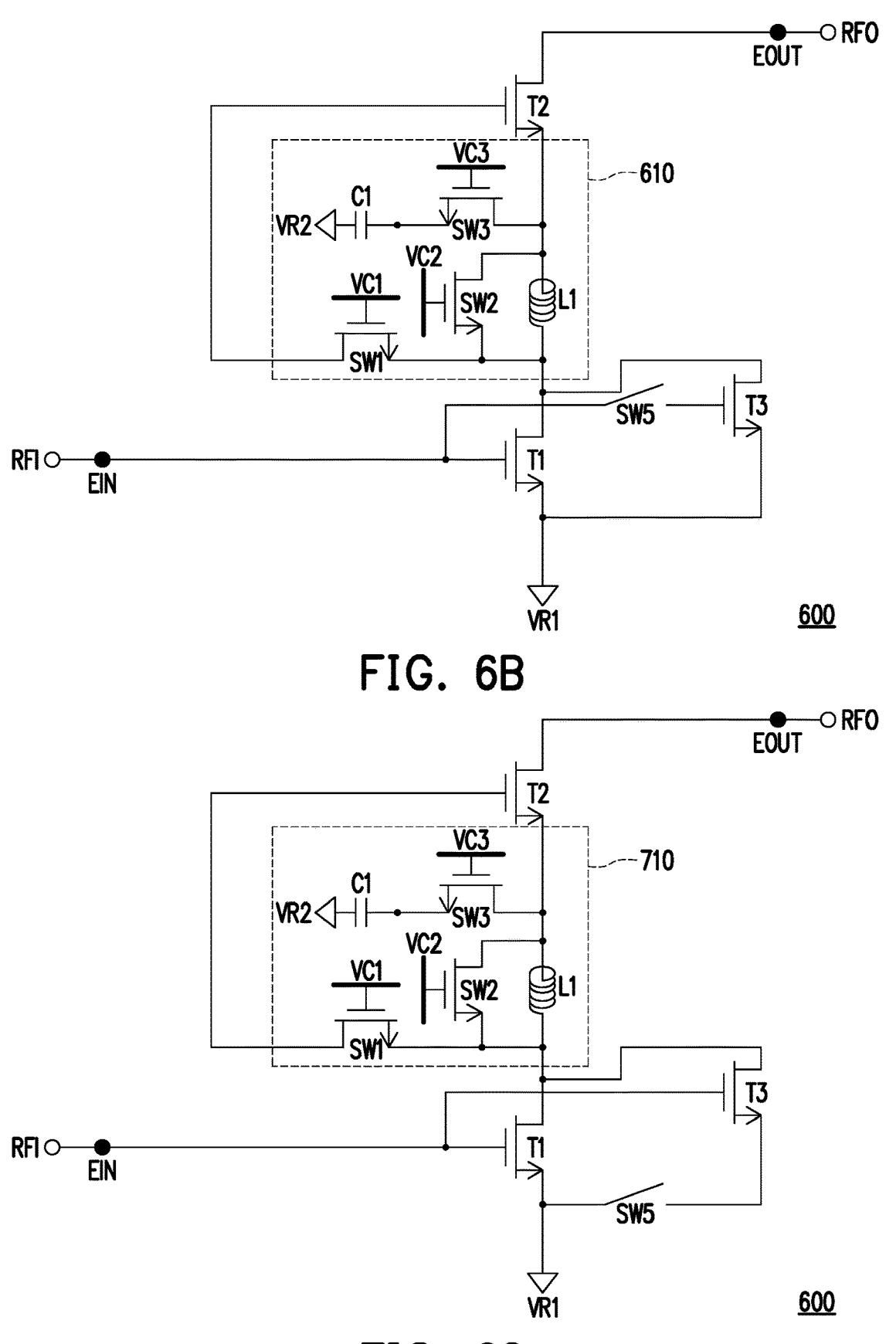

With reference to FIG. 6A to FIG. 6C. FIG. 6A to FIG. 6C are schematic diagrams of different implementations of an amplifying circuit 600 according to another embodiment of the disclosure. The amplifying circuit 600 is similar to the amplifying circuit 200 in FIG. 2, and is different in that the amplifying circuit 600 further includes a transistor T3 and a switch SW5. To be specific, a first terminal of the transistor T3 is coupled to the first terminal of the transistor T1, a second terminal of the transistor T3 is coupled to the second terminal of the transistor T1, and a control terminal of the transistor T3 is coupled to the control terminal of the transistor T1. The switch SW5 may be coupled between the second terminal of the transistor T3 and the second terminal of the transistor T1 as shown in FIG. 6A. Nonetheless, the disclosure is not limited thereto. In other embodiments, the switch SW5 may be coupled between the control terminal of the transistor T3 and the control terminal of the transistor T1 (as shown in FIG. 6B), or coupled between the first terminal of the transistor T3 and the first terminal of the transistor T1 (as shown in FIG. 6C).

Figure 7:
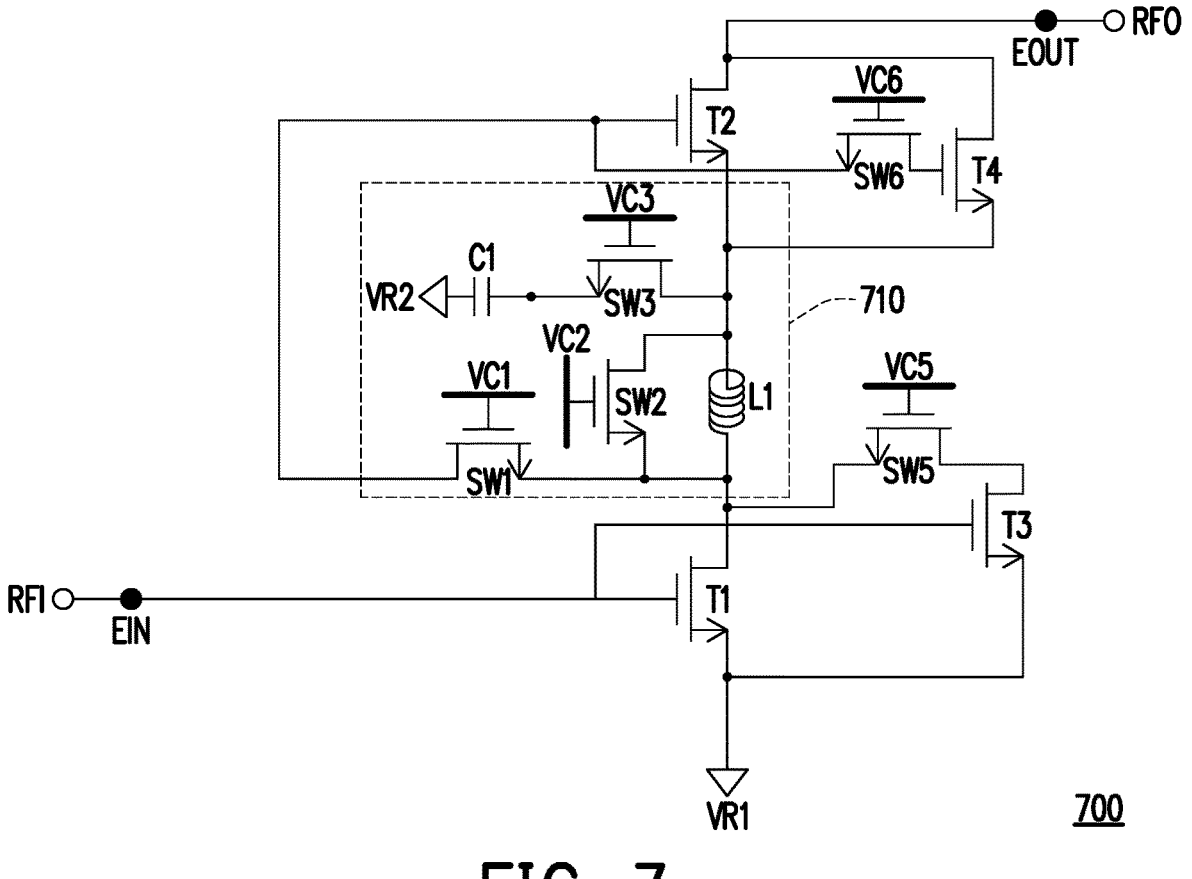

With reference to FIG. 7. FIG. 7 is a schematic diagram of an amplifying circuit 700 according to another embodiment of the disclosure. The amplifying circuit 700 is similar to the amplifying circuit 600 in FIG. 6A, and is different in that the amplifying circuit 700 further includes a transistor T4 and a switch SW6. To be specific, the coupling relationship between the transistor T4 and the transistor T2 is similar to the coupling relationship between the transistor T3 and the transistor T1 in FIG. 6A, which will not be repeatedly described here. As shown in FIG. 7, the switch SW6 may be coupled between a control terminal of the transistor T4 and the control terminal of the transistor T2. Nonetheless, the disclosure is not limited thereto. In other embodiments, the switch SW6 may be coupled between a second terminal of the transistor T4 and the second terminal of the transistor T2, or coupled between a first terminal of the transistor T4 and the first terminal of the transistor T2.

With continued reference to FIG. 7, when the amplifying circuit 700 operates in a general mode, the switch SW2 is turned on and the switch SW1 is turned off, and the second radio frequency signal RF2 at the first terminal of the transistor T1 is transmitted to the first terminal of the transistor T2. In this case, to obtain the expected gain and to improve the linearity, the switch SW5 may be turned on, such that an increased size of the equivalent transistor formed by transistor T1 and the transistor T3 is obtained for generating the second radio frequency signal RF2 (i.e., the sum of the sizes of the transistor T1 and the transistor T3). Further, the switch SW6 may also be turned on, such that an increased size of the equivalent transistor formed by the transistor T2 and the transistor T4 is obtained for generating the output signal RFO (i.e., the sum of the sizes of the transistor T2 and the transistor T4). Accordingly, the linearity of the amplifying circuit 700 may be improved. In the embodiment above, the switches SW5 and/or SW6 may be transistor switches, such as P-type or N-type transistors, and the switches SW5 and SW6 may be respectively controlled by control signals VC5 and VC6.

Figure 8:
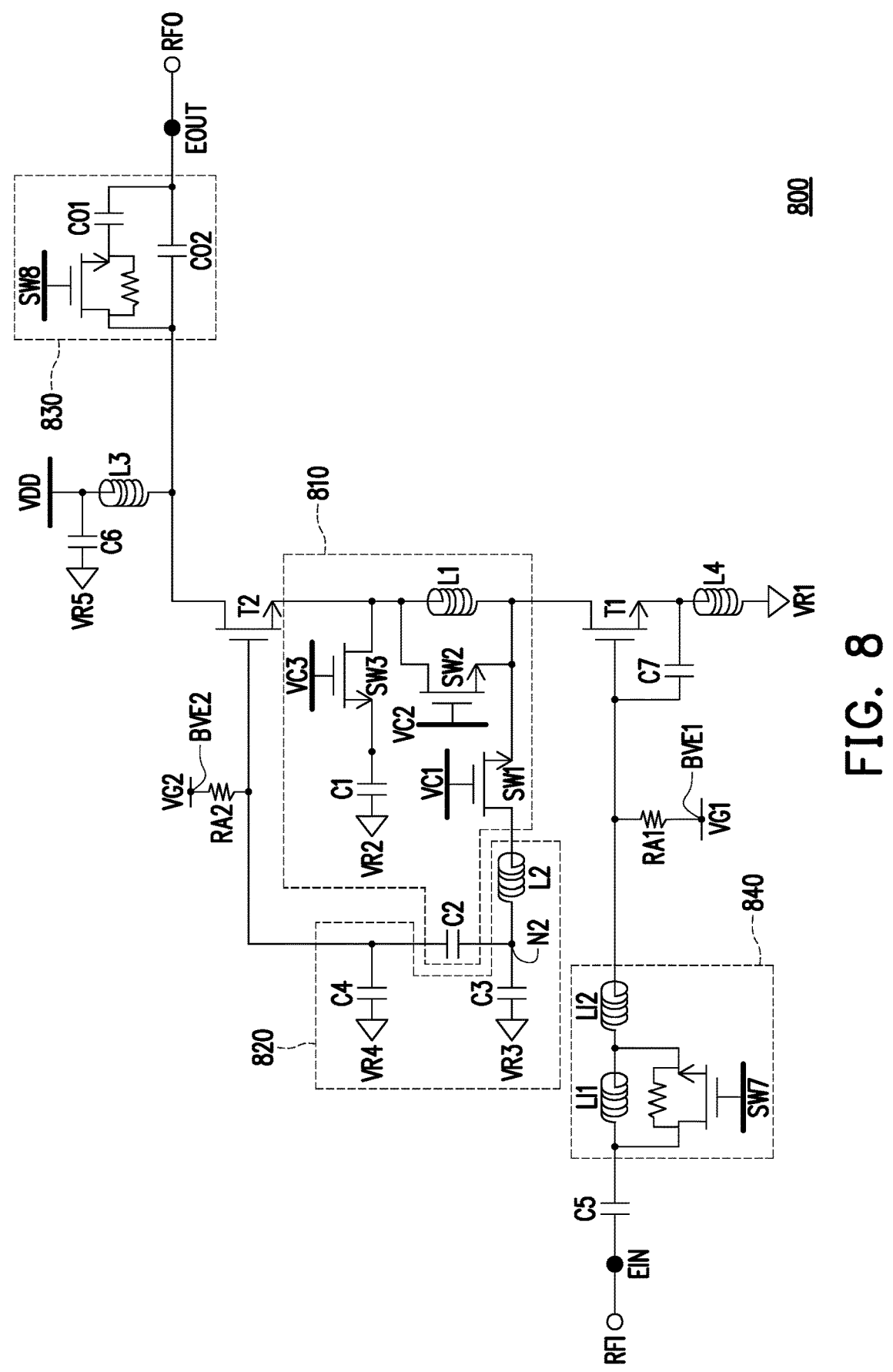

Next, with reference to FIG. 8, FIG. 8 is a schematic diagram of an amplifying circuit 800 according to another embodiment of the disclosure. The amplifying circuit 800 includes the transistors T1 and T2 and a switching circuit 810. The transistors T1 and T2 are similar as described in any one of the embodiments above, and the switching circuit 810 has a circuit structure similar to that of the switching circuit 310 in FIG. 3, which will not be repeatedly described here.

As shown in FIG. 8, the amplifying circuit 800 further includes a capacitor C5, an input matching network 840, an intermediate matching network 820, and an output matching network 830. In some embodiments, the capacitor C5 is coupled to the input terminal EIN of the amplifying circuit 800 to block DC components in the radio frequency signal RFI. The input matching network 840 may be coupled to the input terminal EIN of the amplifying circuit 800 via the capacitor C5. The input matching network 840 may be coupled in series with the capacitor C5 and serves as an input impedance matching element of the amplifying circuit 800. For example, the input matching network 840 may include a switch SW7 and inductors LI1 and LI2. The inductors LI1 and LI2 may be coupled in series on the transmission path of the radio frequency signal RFI. The switch SW7 may be coupled in parallel with the inductor LI1 to change the impedance value of the input matching network 840 depending on requirements. In some embodiments, the intermediate matching network 820 may be coupled between the transistors T1 and T2. To be specific, the intermediate matching network 820 may be coupled between the switching circuit 810 and the control terminal of the transistor T2. The intermediate matching network 820 may in detail include an inductor L2 and capacitors C3 and C4. The inductor L2 is coupled between the second terminal of the transistor T1 and the control terminal of the transistor T2, and may be connected in series with the capacitor C2 of the switching circuit 810. As shown in FIG. 8, a node N2 is present between the switch SW1 and the capacitor C2 of the switching circuit 810. In other words, the switch SW1 and the capacitor C2 are each coupled to the node N2. In the embodiment shown in FIG. 8, the inductor L2 may be coupled between the switch SW1 and the node N2, and the capacitor C3 may be coupled between the node N2 and a reference end VR3, but the disclosure is not limited thereto. In other embodiments, the inductor L2 may be coupled between the node N2 and the capacitor C2. The capacitor C4 may be coupled between the control terminal of the transistor T2 and a reference end VR4. In this embodiment, the intermediate matching network 820 may serve as an impedance matching element between the transistors T1 and T2. In some embodiments, the output matching network 830 may be coupled to the output terminal EOUT of the amplifying circuit 800 and serve as an output impedance matching element of the amplifying circuit 800. The output matching network 830 may include a switch SW8 and capacitors CO1 and CO2. The capacitors CO1 and CO2 may be coupled in parallel on the transmission path of the amplified signal RFO, and the switch SW8 may be coupled in series with the capacitor CO1 to change the impedance value of the output matching network 830 depending on requirements.

As shown in FIG. 8, the amplifying circuit 800 further includes a resistor RA1 and a resistor RA2. The control terminal of the transistor T1 may be coupled to a bias signal end BVE1 via the resistor RA1, to receive a bias signal VG1.

The control terminal of the transistor T2 may be coupled to a bias signal end BVE2 via the resistor RA2, to receive a bias signal VG2. In some embodiments, the bias signals VG1 and VG2 may be DC signals. The amplifying circuit 800 further includes a capacitor C7 and an inductor L4. The capacitor C7 may be coupled between the control terminal and the first terminal of the transistor T1, and the inductor L4 may be coupled between the first terminal of the transistor T1 and the reference end VR1. The amplifying circuit 800 further includes an inductor L3 and a capacitor C6. The transistor T2 (e.g., the second terminal of the transistor T2) may be coupled to a power voltage end via the inductor L3, to receive a power voltage signal VDD. A terminal of the capacitor C6 may be coupled to the inductor L3, and another terminal of the capacitor C6 may be coupled to a reference end VR5. In this embodiment, a capacitor may be further disposed at the output terminal EOUT of the amplifying circuit 800, and this capacitor may also be coupled to any reference end.

In the embodiment above, the reference ends VR1 to VR5 may be the same reference ground end, and may also respectively be different ends. In addition, it should be noted that, in the disclosure, ordinal number words (e.g., first, second, third . . . ) are only used to distinguish functions or positions, and do not represent a sequence or a quantity.

In summary of the foregoing, in the embodiment of the disclosure, the switching circuit is disposed in the amplifying circuit, and according to various operation modes of the amplifying circuit, the switching circuit may cause the amplifying circuit to be in a cascode mode or a cascade mode in response to different application requirements. For example, when the amplifying circuit is in the cascode mode, isolation between input and output may be improved, and thus coupling between the input signal and the output signal may be reduced, so that the amplifying circuit may operate at a relatively large bandwidth. When the amplifying circuit is in the cascade mode, a relatively high amplification gain may be provided. Further, the transistors of the amplifying circuit may share a DC in both modes above. Accordingly, according to the embodiment of the disclosure, the amplifying circuit may improve the operating performance of the system with relatively low power consumption.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An amplifying circuit comprising:
a first transistor having a first terminal, a second terminal, and a control terminal, the control terminal of the first transistor being coupled to an input terminal of the amplifying circuit, and the first terminal of the first transistor being coupled to a first reference end, wherein the input terminal of the amplifying circuit is configured to receive a first radio frequency signal;
a second transistor having a first terminal, a second terminal, and a control terminal, the first terminal of the second transistor being coupled to the second terminal of the first transistor, and the second terminal of the second transistor being coupled to an output terminal of the amplifying circuit, wherein the output terminal of the amplifying circuit is configured to output an amplified signal;

a switching circuit coupled to the second terminal of the first transistor, the first terminal of the second transistor, and the control terminal of the second transistor,
wherein the first transistor amplifies the first radio frequency signal to generate a second radio frequency signal at the second terminal of the first transistor, the switching circuit performs a switching operation to transmit the second radio frequency signal to one of the first terminal of the second transistor and the control terminal of the second transistor,
wherein the switching circuit comprises:
a first inductor coupled between the second terminal of the first transistor and the first terminal of the second transistor;
a first switch coupled between the second terminal of the first transistor and the control terminal of the second transistor; and
a second switch coupled in parallel with the first inductor.

2. The amplifying circuit according to claim 1, wherein the switching circuit further comprises:
a first capacitor; and
a third switch coupled in series with the first capacitor between the first terminal of the second transistor and a second reference end.

3. The amplifying circuit according to claim 2, wherein the switching circuit further comprises:
a second capacitor coupled in series with the first switch between the second terminal of the first transistor and the control terminal of the second transistor.

4. The amplifying circuit according to claim 3, wherein the first switch and the second switch are respectively controlled by a first control signal and a second control signal to be turned on or turned off,
wherein when the first switch is off and the second switch is on, the second radio frequency signal is transmitted through the second switch to the first terminal of the second transistor, and
when the first switch is on and the second switch is off, the second radio frequency signal is transmitted through the first switch to the control terminal of the second transistor.

5. The amplifying circuit according to claim 1, wherein the first transistor and the second transistor share a direct current.

6. The amplifying circuit according to claim 4, wherein when the second radio frequency signal is transmitted to the control terminal of the second transistor, the first inductor presents a high impedance state for the second radio frequency signal, the first capacitor presents a low impedance state for the second radio frequency signal, and the second capacitor presents a low impedance state for the second radio frequency signal.

7. The amplifying circuit according to claim 6, wherein when the first switch is on, the first switch presents a low impedance state for the second radio frequency signal; when the second switch is on, the second switch presents a low impedance state for the second radio frequency signal; and when the third switch is on, the third switch presents a low impedance state for the second radio frequency signal.

8. The amplifying circuit according to claim 4, wherein the third switch is controlled by a third control signal, the third switch is turned on or turned off according to the third control signal, and when the first switch is turned on, the third switch is turned on, such that the second transistor is coupled to the second reference end via the first capacitor.

9. The amplifying circuit according to claim 8, wherein the switching circuit further comprises:

a fourth switch, wherein the first terminal of the second transistor, the third switch, the first capacitor, and the second reference end are sequentially coupled, the third switch and the first capacitor are coupled to a node, and the fourth switch is coupled between the node and the control terminal of the second transistor.

10. The amplifying circuit according to claim 9, wherein the fourth switch is controlled by a fourth control signal, the fourth switch is turned on or turned off according to the fourth control signal, and wherein when the second switch is turned on, the fourth switch is turned on, such that the control terminal of the second transistor is coupled to the second reference end via the first capacitor.

11. The amplifying circuit according to claim 4, wherein the switching circuit further comprises:

a first operation resistor coupled between a first terminal and a second terminal of the first switch; and a second operation resistor coupled between a first terminal and a second terminal of the second switch.

12. An amplifying circuit comprising:

a first transistor having a first terminal, a second terminal, and a control terminal, the control terminal of the first transistor being coupled to an input terminal of the amplifying circuit, and the first terminal of the first transistor being coupled to a first reference end, wherein the input terminal of the amplifying circuit is configured to receive a first radio frequency signal;

a second transistor having a first terminal, a second terminal, and a control terminal, the first terminal of the second transistor being coupled to the second terminal of the first transistor, and the second terminal of the second transistor being coupled to an output terminal of the amplifying circuit, wherein the output terminal of the amplifying circuit is configured to output an amplified signal;

a switching circuit coupled to the second terminal of the first transistor, the first terminal of the second transistor, and the control terminal of the second transistor, wherein the first transistor amplifies the first radio frequency signal to generate a second radio frequency signal at the second terminal of the first transistor, the switching circuit performs a switching operation to transmit the second radio frequency signal to one of the first terminal of the second transistor and the control terminal of the second transistor, the amplifying circuit further comprising:

a third transistor having a first terminal, a second terminal, and a control terminal, the first terminal of the third transistor being coupled to the first terminal of the first transistor, the second terminal of the third transistor being coupled to the second terminal of the first transistor, and the control terminal of the third transistor being coupled to the control terminal of the first transistor; and a fifth switch coupled between the first terminal of the first transistor and the first terminal of the third transistor, or coupled between the second terminal of the first transistor and the second terminal of the third transistor, or coupled between the control terminal of the first transistor and the control terminal of the third transistor;

or the amplifying circuit further comprising:

a fourth transistor having a first terminal, a second terminal, and a control terminal, the first terminal of the fourth transistor being coupled to the first terminal of the second transistor, the second terminal of the fourth transistor being coupled to the second terminal of the second transistor, and the control terminal of the fourth transistor being coupled to the control terminal of the second transistor; and a sixth switch coupled between the first terminal of the second transistor and the first terminal of the fourth transistor, or coupled between the second terminal of the second transistor and the second terminal of the fourth transistor, or coupled between the control terminal of the second transistor and the control terminal of the fourth transistor.

13. The amplifying circuit according to claim 12, wherein the control terminal of the first transistor is coupled to a first bias signal end, the first bias signal end is configured to receive a first bias signal, the control terminal of the second transistor is coupled to a second bias signal end, and the second bias signal end is configured to receive a second bias signal.

14. The amplifying circuit according to claim 13, further comprising:

a first resistor; and a second resistor, wherein the control terminal of the first transistor is coupled to the first bias signal end via the first resistor, and the control terminal of the second transistor is coupled to the second bias signal end via the second resistor.

15. The amplifying circuit according to claim 3, further comprising:

an intermediate matching network comprising:

a second inductor coupled between the second terminal of the first transistor and the control terminal of the second transistor, and coupled in series with the second capacitor;

a third capacitor, wherein the first switch and the second capacitor are jointly coupled to a node, and the third capacitor is coupled between the node and a third reference end; and a fourth capacitor coupled between the control terminal of the second transistor and a fourth reference end.

16. The amplifying circuit according to claim 3, further comprising:

an input matching network coupled to the input terminal of the amplifying circuit; and an output matching network coupled to the output terminal of the amplifying circuit.

17. The amplifying circuit according to claim 13, wherein the second terminal of the second transistor is coupled to a first power voltage end and configured to receive a first power voltage signal.

18. An amplifying circuit comprising:

an input terminal configured to receive a first radio frequency signal;

an output terminal configured to output an amplified signal;

a first transistor having a first terminal, a second terminal, and a control terminal, wherein the control terminal of the first transistor is coupled to the input terminal, and the first terminal of the first transistor is coupled to a first reference end;

a second transistor having a first terminal, a second terminal, and a control terminal, wherein the second terminal of the second transistor is coupled to the output terminal;

a first inductor coupled between the second terminal of the first transistor and the first terminal of the second transistor;

a first switch coupled between the second terminal of the first transistor and the control terminal of the second transistor;

a second switch coupled in parallel with the first inductor;

a first capacitor; and a third switch coupled in series with the first capacitor, wherein the first capacitor and the third switch are coupled between the first terminal of the second transistor and a second reference end.

19. The amplifying circuit according to claim 18, further comprising:

a second capacitor coupled in series with the first switch between the second terminal of the first transistor and the control terminal of the second transistor.

* * * * *